US008766656B2

United States Patent
Malik et al.

(10) Patent No.: US 8,766,656 B2
(45) Date of Patent: Jul. 1, 2014

(54) SYSTEMS AND METHODS FOR THERMAL CONTROL

(71) Applicants: Zafar Malik, Milpitas, CA (US); David Jackson, Milpitas, CA (US)

(72) Inventors: Zafar Malik, Milpitas, CA (US); David Jackson, Milpitas, CA (US)

(73) Assignee: Silicon Turnkey Solutions Inc., Milpitas, CA (US)

(*) Notice: Subject to any disclaimer, the term of this patent is extended or adjusted under 35 U.S.C. 154(b) by 0 days.

(21) Appl. No.: 13/865,005

(22) Filed: Apr. 17, 2013

(65) Prior Publication Data

US 2013/0285686 A1 Oct. 31, 2013

Related U.S. Application Data

(60) Provisional application No. 61/625,907, filed on Apr. 18, 2012.

(51) Int. Cl.
*G01R 31/10* (2006.01)
*G01R 31/28* (2006.01)

(52) U.S. Cl.
CPC ........ *G01R 31/2875* (2013.01); *G01R 31/2877* (2013.01)
USPC ............. 324/750.05; 324/750.11; 324/750.14

(58) Field of Classification Search
None
See application file for complete search history.

(56) References Cited

U.S. PATENT DOCUMENTS

| 6,728,653 | B1* | 4/2004 | Figueredo | ................... 702/117 |
| 7,436,059 | B1* | 10/2008 | Ouyang | ...................... 257/712 |
| 2009/0153171 | A1* | 6/2009 | Lee et al. | ...................... 324/760 |
| 2011/0139207 | A1* | 6/2011 | Edwards | ...................... 136/230 |

* cited by examiner

*Primary Examiner* — Minh N Tang
(74) *Attorney, Agent, or Firm* — Ellahie & Farooqui LLP

(57) ABSTRACT

The present invention relates generally to a system and a method for thermal control. More particularly, the invention encompasses an apparatus for thermal control and management of at least one device under test (DUT). The inventive thermal control and management apparatus also allows for the management of a plurality of devices under test, and with each device under test having its own testing regimen. The thermal control and management of the device under test (DUT) is managed using at least one thermoelectric element or cooler (TEC), which can be used to either heat or cool the corresponding device under test (DUT).

23 Claims, 6 Drawing Sheets

SYSTEMS AND METHODS FOR THERMAL CONTROL

CROSS-REFERENCE TO RELATED APPLICATION

The instant patent application claims priority to and the benefit of U.S. Provisional Patent Application Ser. No. 61/625,907, filed on Apr. 18, 2012, titled "Systems and Methods for Thermal Control," the entire disclosure of which provisional application is incorporated herein by reference.

FIELD OF THE INVENTION

The present invention relates generally to a system and a method for thermal control. More particularly, the invention encompasses an apparatus for thermal control, and management of at least one device under test (DUT). The inventive thermal control and management apparatus also allows for the management of a plurality of devices under test, and with each device under test having its own testing regimen. The thermal control and management of the device under test (DUT) is managed using at least one thermoelectric element or cooler (TEC), which can be used to either heat or cool the corresponding device under test (DUT).

BACKGROUND INFORMATION

High Temperature Operating Life (HTOL) is one method of estimating the operating life of a product.

The High Temperature Operating Life (HTOL) or steady-state life test is performed to determine the reliability of devices under operation at high temperature conditions over an extended period of time. It consists of subjecting the parts to a specified bias or electrical stressing, for a specified amount of time, and at a specified high temperature, or in other words it is a long-term burn-in.

Unlike production burn-in which accelerates early life failures, HTOL testing is applied to assess the potential operating lifetimes of the sample population (hence the term 'life test'). It is therefore mote concerned with acceleration of wear-out failures. As such, life tests should have sufficient durations to assure that the results are not due to early life failures or infant mortality.

A light emitting diode (LED) is a semiconductor light source. LEDs are used as indicator lamps in many devices and are increasingly used for other lighting.

Light-emitting diodes are used in applications as diverse as replacements for aviation lighting, automotive lighting (in particular brake lamps, turn signals, and indicators) as well as in traffic signals. LEDs have allowed new text, video displays, and sensors to be developed, while their high switching rates are also useful in advanced communications technology. Infrared LEDs are also used in the remote control units of many commercial products including televisions, DVD players, and other domestic appliances.

Thermo-electric cooler (TEC) or thermoelectric cooling uses the Peltier effect to create a heat flux, between the junctions of two different types of materials. A Peltier cooler, heater, or thermoelectric heat pump is a solid-state active heat pump which transfers heat from one side of the device to the other side against the temperature gradient (from cold to hot, or from hot to cold), with consumption of electrical energy. Such an instrument is also called a Peltier device, Peltier heat pump, solid state refrigerator, or thermoelectric cooler (TEC). The Peltier device is a heat pump; when direct current runs through it, heat is moved from one side to the other. Therefore, it can be used either for heating or for cooling (refrigeration), although in practice the main application is cooling. It can also be used as a temperature controller that either heats or cools.

The thermoelectric cooling technology is far less commonly applied to refrigeration than, for example, vapor-compression refrigeration. The main advantages of a Peltier cooler (contrasted to a vapor-compression refrigerator) are its lack of moving parts or circulating liquid, mid its small size and flexible shape (form factor). Its main disadvantage is that it cannot simultaneously have low cost and high power efficiency. Many researchers and companies are trying to develop Peltier coolers that are both inexpensive and efficient.

A Peltier cooler is the opposite of a thermoelectric generator. In a Peltier cooler, electric power is used to generate a temperature difference between the two sides of the device, while in a thermoelectric generator; a temperature difference between the two sides is used to generate electric power. The operation of both is closely related (both are manifestations of the thermoelectric effect), and therefore the devices are generally constructed from similar materials using similar designs.

Device under test (DUT) in semiconductor testing refers to a specific die on a wafer or the resulting packaged part. Using a connection system, the part is connected to a manual or an automatic test equipment (ATE). The ATE then applies power to the part, supplies stimulus signals and then measures and evaluates the resulting outputs from the device. In this way, the ATE determines whether the particular device under test (DUT) is good or bad.

While in water form, the ATE connects to the individual DUT (die), using a set of microscopic needles (or probe card). Once the wafer is sa wed-off and the passing die are singulated, and assembled in a package, the ATE connects to the DUT (package) via sockets (sometimes called contactors). The DUT board is often connected to the ATE via a bed of nails of pogo pins.

The term device under test (DUT) is also used more generally within electronics to refer to any electronic assembly under test. For example, cell phones coming off of an assembly line may be given a final test in the same way as the individual die were earlier tested. Each cell phone under test is, briefly, the DUT.

A Proportional Integral Derivative (PID) controller or loop is a generic control feedback loop (controller) widely used in industrial control systems—a PID is the most commonly used feedback controller. A PID controller calculates an "error" value as the difference between a measured process variable and a desired setpoint. The controller attempts to minimize the error by adjusting the process control inputs.

The PID controller calculation (algorithm) involves three separate constant parameters, and is accordingly sometimes called three-term control: the Proportional, the Integral, and Derivative values, denoted by, P, I, and D, respectively. Heuristically, these values can be interpreted in terms of time; P depends on the present error, I on the accumulation of past errors, and D is a prediction of future errors, based on current rate of change. The weighted sum of these three actions is used to adjust the process via a control element; such as, the position of a control valve, or the power supplied to a heating element.

In the absence of knowledge of the underlying process, a PID controller is a good controller to use. By tuning the three parameters in the PID controller algorithm, the controller can provide control action designed for specific process requirements. The response of the controller can be described in terms of the responsiveness of the controller to an error, the degree to which the controller overshoots the set-point and the degree of system oscillation. It should also be noted that the use of the PID algorithm for control does not guarantee optimal control of the system or system stability.

Some applications may require using only one or two actions to provide the appropriate system control. This can be achieved, for example, by setting the other parameters to zero. A PID controller may be called a PI, PD, P or I controller in the absence of the respective control actions. PI controllers are fairly common, since derivative action is sensitive to measurement noise, whereas the absence of an integral term may prevent the system from reaching its target value due to the control action.

U.S. Pat. No. 5,973,050 (George H. Johnson, et al), the entire disclosure of which is incorporated herein by reference, discloses a composition of matter in which nanophase metal particles are effectively dispersed in a polymer matrix so that hitherto unattainable thermoelectric properties are attained. Preferred polymers and metals are taught. A method of making the composition of matter useful as a thermoelectric composite material using a conducting polymer matrix is disclosed as is a thermoelectric cooling/heating device which uses that composition.

U.S. Pat. No. 6,463,743 (Jacques Laliberte), the entire disclosure of which is incorporated herein by reference, discloses a modular thermoelectric cooling/heating unit which is installed through an opening in a wall separating first and second temperature zones. This modular thermoelectric cooling/heating unit comprises a thermoelectric device including a cold surface, a hot surface, and a cooling/heating member between an electrical power supply and the cold and hot surfaces. A heat conducting block has a proximal end for thermally contacting with a first one of the cold and hot surfaces, and a distal end. A first heatsink thermally contacts with a second one of the cold and hot surfaces, a second heatsink thermally contacts with the distal end of the heat conducting block, and a thermally insulated housing covers at least a portion of the heat conducting block between the proximal and distal ends of this block. In operation, the first heatsink is located in the first temperature zone, at least a portion of the heat conducting block; and the thermally insulated housing extend through the wall opening, and the second heatsink is located in the second temperature zone. The above described modular thermoelectric cooling/heating unit can be used in a modular cooling system for retrofit into an existing refrigeration unit.

U.S. Pat. No. 7,059,137 (William H. Childress), the entire disclosure of which is incorporated herein by reference, discloses an invention which uses electric current to either chill or warm air ambient air. The Portable Thermoelectric Cooling and Heating Device is composed of an array of thermoelectric units, a driving fan, a cold sink, a hot sink, air baffles and a cooling fan. The thermoelectric units are arranged in contact with the cold sink (cold side) and hot sink (hot side). Applying a current causes a temperature difference to develop between each side. The driving fan creates a pressure gradient is to pull air through the center of the cold sink. The cooling fan pulls air through an arrangement of baffles connected to the hot sink to help dissipate heat. The result is chilled or hot air, depending on the direction of the current. The invention allows for several improvements over current heating and air-conditioning systems; a simplified design without moving parts, elimination of the need for FREON, improved versatility and others.

U.S. Pat. No. 7,164,077 (Rama Venkatasubramanian), the entire disclosure of which is incorporated herein by reference, discloses a thermoelectric cooling and heating device including a substrate, a plurality of thermoelectric elements arranged on one side of the substrate and configured to perform at least one of selective heating and cooling such that each thermoelectric element includes a thermoelectric material, a Peltier contact contacting the thermoelectric material and forming under electrical current flow at least one of a heated junction and a cooled junction, and electrodes configured to provide current through the thermoelectric material and the Peltier contact. As such, the thermoelectric cooling and heating device selectively biases the thermoelectric elements to provide on one side of the thermoelectric device a grid of localized heated or cooled junctions.

U.S. Patent Publication No. 2002/0117747 (Mindaugas F. Dautartas, et al.), the entire disclosure of which is incorporated herein by reference, discloses a method and apparatus for supporting semiconductor devices on a flexible support which includes one or more thermoelectric cooling devices. The thermoelectric cooling devices, which include at least one pair of positively-doped and negatively-doped elements electrically coupled together, are positioned between a pair of flex panels. Each panel has connector sites at which connectors such as solder balls are located. Hie thermoelectric cooling devices may be arranged between the panels to create two or more device support areas having different temperature regimes. The thermoelectric cooling devices may be connected to the panels by placing the panels, connectors and thermoelectric cooling devices in a reflow chamber, exposing them to a reducing atmosphere, and heating to a temperature sufficient to reflow the connectors.

U.S. Patent Publication No. 2009/0188259 (Renato Colja, et al.), the entire disclosure of which is incorporated herein by reference, discloses an integrated thermoelectric cooling element and a positive temperature coefficient heating element are integrated into a single package. A heat sink is shared between the thermoelectric cooling element and the positive temperature coefficient.

This invention improves on the deficiencies of the prior art and provides an inventive system and a method for thermal control and management.

PURPOSES AND SUMMARY OF THE INVENTION

The invention is a novel system and a method for thermal control and management.

Therefore, one purpose of this invention is to provide a cost effective, and a novel system and a method for thermal control and management.

Another purpose of this invention is to provide an inventive apparatus for thermal control and management of at least one device under test (DUT).

Yet another purpose of this invention is to provide an inventive thermal, control and management apparatus, that also allows for the management, of a plurality of devices under test, and with each device under test having its own testing regimen.

Therefore, in one aspect this invention comprises a thermal control and management apparatus, comprising:
(a) a bottom cold plate, said bottom cold plate having an upper surface and a lower surface;
(b) a top cold plate, said top cold plate having an upper surface and a lower surface;
(c) at least one thermoelectric cooler between said lower surface of said top cold plate, and said upper surface of said bottom cold plate;
(d) a device under test board, and wherein said device under test board is in electrical contact with a power supply;

(e) at least one device under test, and wherein said device under test is in electrical contact with said power supply via said device under test board, and wherein said at least one device under test is located on said upper surface of said top cold plate such that said at least one thermoelectric cooler can thermally influence said at least one device under test when said thermoelectric cooler is activated; and (f) a controller, wherein said controller has at least one first means to provide power to said at least one thermoelectric cooler to thermally activate said at least one thermoelectric cooler, and wherein said controller has at least one second means to monitor and manage the thermal impact on said at least one device under test from said thermal activation of said at least one thermoelectric cooler.

In another aspect, this invention comprises a thermoelectric cooling and heating apparatus, comprising:

(a) a bottom cold plate, said bottom cold plate having an upper surface and a lower surface;

(b) a top cold plate, said top cold plate having an upper surface and a lower surface;

(c) at least one thermoelectric element arranged between said lower surface of said top cold plate, and said upper surface of said bottom cold plate, and configured to perform at least one of selective heating and cooling, each of said at least one thermoelectric element including, a thermoelectric material, a Peltier contact contacting said thermoelectric material and configured to form under electrical current flow at least one of a heated junction and a cooled junction, and electrodes configured to provide electric current through said thermoelectric material and said Peltier contact;

(d) a device under test board, and wherein said device under test board is in electrical contact with a power supply;

(e) at least one device under test, and wherein said device under test is in electrical contact with said power supply via said device under test board, and wherein said at least one device under test is located on said upper surface of said top cold plate such that, said at least one thermoelectric element can thermally influence said at least one device under test when said thermoelectric element is activated; and (f) a controller, wherein said controller is configured to independently control said electrodes of said at least one thermoelectric element, said controller being further configured to bias said electrodes to provide one of heating and/or cooling to said at least one thermoelectric element, and wherein said controller has at least one means to monitor the thermal impact on said at least one device under test from said thermal activation of said at least one thermoelectric element.

In yet another aspect this invention comprises a method for providing thermoelectric cooling and heating, comprising the steps of:

(a) sandwiching at least one thermoelectric element between a bottom cold plate and a top cold plate, said at least one thermoelectric element arranged between a lower surface of said top cold plate, and an upper surface of said bottom cold plate, and configured to perform at least one of selective heating and cooling, and wherein each of said at least one thermoelectric element including, a thermoelectric material, a Peltier contact contacting said thermoelectric material and configured to form under electrical current flow at least one of a heated junction and a cooled junction, and electrodes configured to provide electric current through said thermoelectric material and said Peltier contact;

(b) placing a device under test board, and wherein said device under test board is in electrical contact with a power supply;

(c) placing at least one device under test on said upper surface of said top cold plate, and wherein said device under test is in electrical contact with said power supply via said device under test board, and wherein said at least one thermoelectric element is configured to thermally influence said at least one device under test when said thermoelectric element is activated; and (d) providing a controller, wherein said controller is configured to independently control said electrodes of said at least one thermoelectric element, said controller being further configured to bias said electrodes to provide one of heating and/or cooling to said at least one thermoelectric element, and wherein said controller has at least one means to monitor the thermal impact on said at least one device under test from said thermal activation of said at least one thermoelectric element.

BRIEF DESCRIPTION OF THE DRAWINGS

Although the scope of the present invention is much broader than any particular embodiment, a detailed description of the preferred embodiment follows together with drawings. These drawings are for illustration purposes only and are not drawn to scale. Like numbers represent like features and components in the drawings. The invention may best be understood by reference to the ensuing detailed description in conjunction with the drawings in which.

DETAILED DESCRIPTION

Conventional air driven High Temperature Operating Life (HTOL) chambers cannot dissipate the significant heat generated by high power Light Emitting Diodes (LEDs), semiconductors, components and other electrical devices. Consequently, the quantity of devices that can be tested at one time within one HTOL chamber is limited, which greatly increases the burn-in cost and cycle time.

As a result, there is a need for systems and methods that can dissipate and strictly regulate the significant heat and also increase the test capacity to overcome the limitations inherent in conventional air driven HTOL chambers. Embodiments of the present invention provide novel systems and methods to the conventional, burn-in methodology.

The embodiments of the present invention are described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as systems, methods, devices, or apparatus. The following detailed description should not to be taken in a limiting sense.

Throughout the specification and claims, the following terms take die meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on." Further reference may be made to an embodiment where a component is implemented and multiple like or identical components are implemented.

Figure 3A:
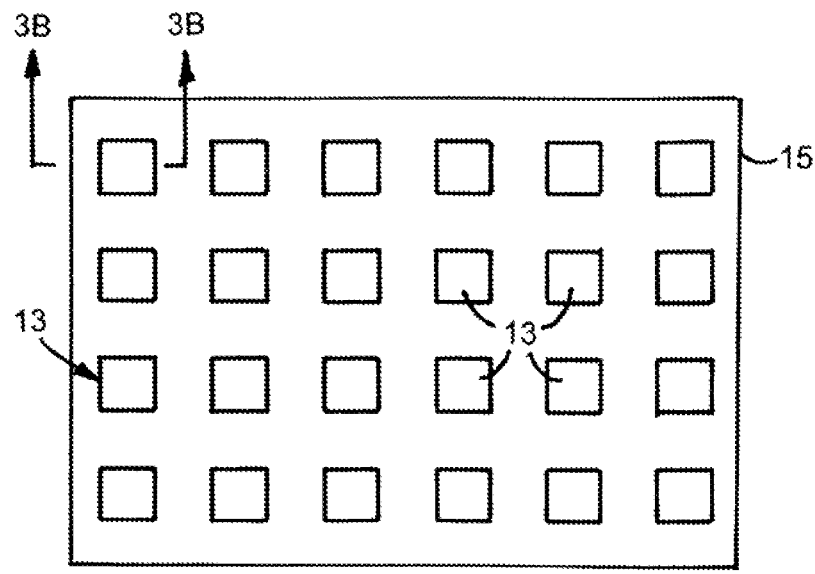
FIG. 3A is a top view of a top cold plate in accordance with an embodiment of the present invention.
Figure 4A:
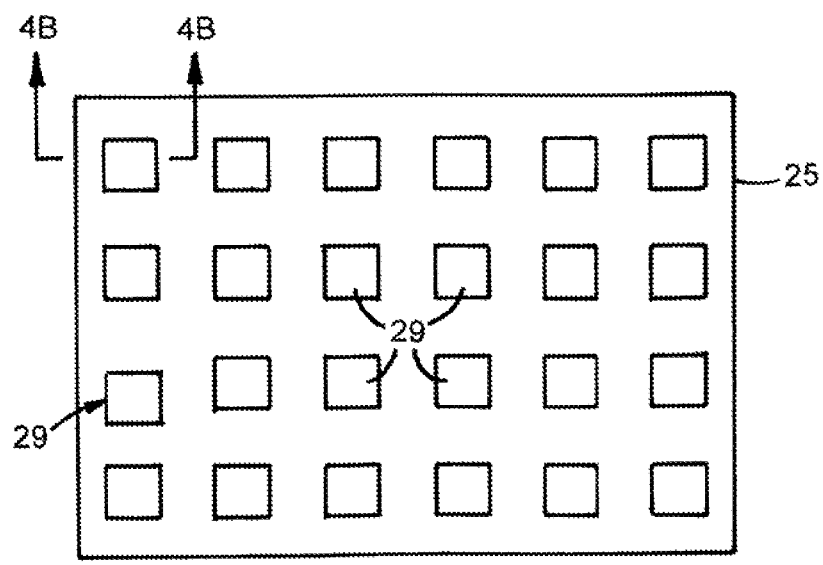
FIG. 4A is a top view of a bottom cold plate in accordance with an embodiment of the present invention.

While the embodiments may make reference to an LED burn-in test unit, this is not intended to be a limitation of the embodiments of the present invention and such is equally applicable to any test unit or application unit where a user may desire to control temperatures, monitor temperatures, or use temperature gradients for any purpose or any device. Likewise, the 24 device under test (DUT) contact sites and the four row by six column arrangement depicted in FIG. 3A, and FIG. 4A, is not intended to be a limitation of the embodiments of the present invention and such is equally applicable to any number of sites or row and column configuration.

Embodiments of the present invention provide alternatives to conventional burn-in tests and further unify temperature gradients of specification temperature, actual operating temperature, ambient temperature and surrounding temperature. This embodiment described herein addresses and solves the current industry bottleneck of burn-in of semiconductors, microprocessors, LEDs, electrical components and other devices through novel, systems and methods.

This unique and novel solution breaks the boundaries of technology, performs component, board and system level burn-in and tests high power dissipative devices enabling thermal regulation. One embodiment of the system, hereinafter referred to as the Innovative Thermal Controller 360 (ITC360™) can be implemented directly on a bench top environment without the use of interconnect devices. Real-time monitoring allows a user to predict early detection of overheating to avoid deterioration and defective components, modules or systems.

Figure 1:
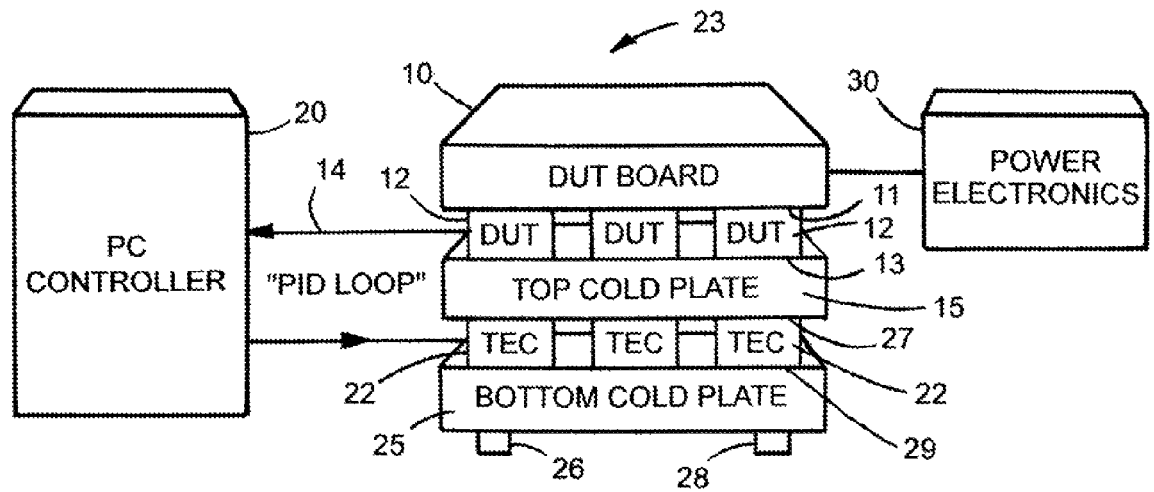
FIG. 1 illustrates a schematic view of a thermal control and management apparatus according to a first embodiment of this invention.

FIG. 1 illustrates a schematic view of a thermal control and management apparatus 23, according to a first embodiment of this invention. As depicted in FIG. 1, in one embodiment of the present invention, the ITC360™ or the inventive thermal control and management apparatus or a thermoelectric cooling and heating apparatus 23, includes a Device Under Test ("DUT") board 10, that holds the device under test (DUT) 12, power electronics 30, to supply power to the device under test (DUT) 12, a top or upper or first cold plate 15, a bottom or lower or second cold plate 25, a Proportional Integral Derivative (PID) loopback system 14, and at least one thermo-electro cooler (TEC) 22, managed by a PC controller 20, running off-the-shelf instrumentation software. In one embodiment the ITC360™ or inventive thermal control and management apparatus or a thermoelectric-cooling and heating apparatus 23, thermally manages high power dissipation, enables accelerated cooling, and controls individual temperature of each of the device under test (DUT) 12, and temperature of the immediate surroundings to prevent the devices 12, from over or under heating. Regulated heat is supplied to stress these units or devices 12, during burn-in, reducing the differential temperature between junction, case and surrounding temperature. For some embodiments, the thermal control and management apparatus 23, could be provided with at least one fluid-in pipe 26, and at least one fluid-out pipe 28. Similarly, for some embodiments, the thermal control and management apparatus 23, could be provided with a base device under test (DUT) area 13, on the upper surface of the top cold plate 15, for the placement of the device under test (DUT) 12, and a top device under test (DUT) area 11, on the device under test (DUT) board 10, for connecting to the device under test (DUT) 12. Similarly, for some embodiments the thermal control and management apparatus 23, could be provided with a base thermo-electro cooler (TEC) area 29, on the upper surface of the bottom cold plate 25, for the placement of the thermo-electro element or cooler (TEC) 22, and a top thermo-electro cooler (TEC) area 27, on the bottom or lower surface of the top cold plate 15, for attaching or interfacing the thermo-electro cooler (TEC) 22, to the top cold plate 15.

In one embodiment, the ITC360™ or the thermal control and management apparatus or the thermoelectric cooling and heating apparatus 23, can be flexibly used for component, module and system level burn-in with full integration and loopback. It can also be extended to a multi-device under test (DUT) sub-module, which may be socketless and chamberless.

Figure 2:
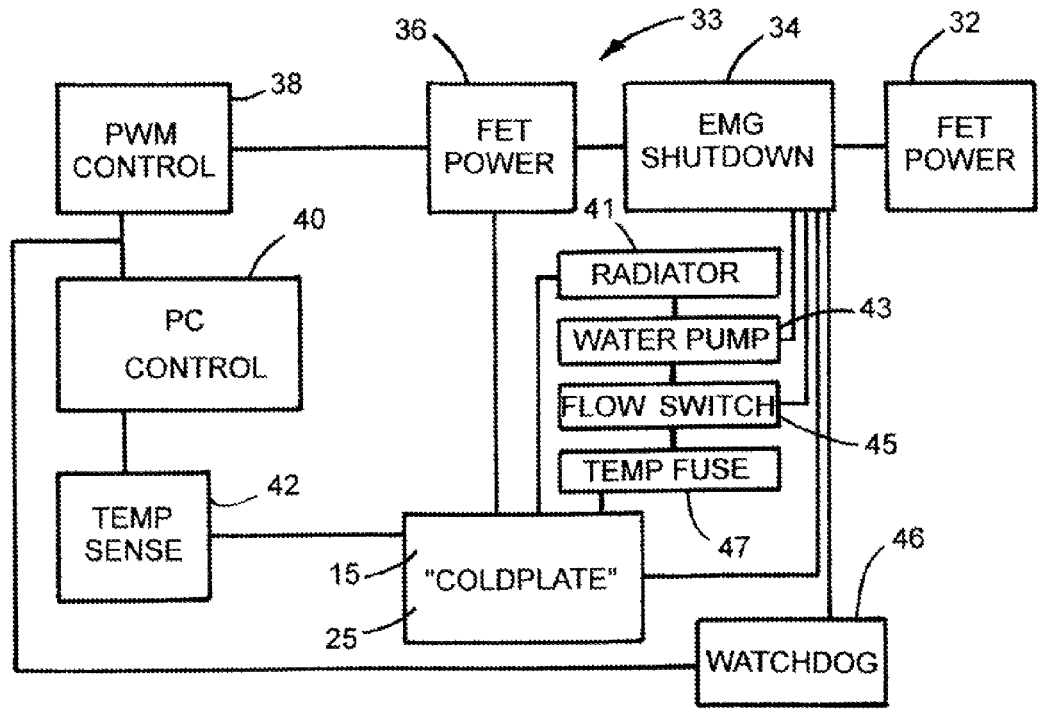
FIG. 2 is an exemplary thermal control and management schematic according to one embodiment of the present invention.

FIG. 2 is an exemplary thermal control and management schematic 33, according to one embodiment of the present invention. In one embodiment 33, the present invention incorporates a Feed Effect Transistor (FET) Power source 32, which regulates power to the cold plates 15, 25. In another embodiment 33, the present invention, incorporates an Emergency (EMG) Shut-down system 34, which in one embodiment 33, has the capability to shut down various components of the present invention. In another embodiment 33, the FET Power supply 32, provides feedback to the emergency shutdown parallel power source 36. In another embodiment 33, the invention incorporates a Pulse With Modulation Control (PWM Control) 38—which may modulate the signal to the FET board 10. In another the invention 33, incorporates a PC Control unit 40, which may be a computer 40, or other similar electronic controller 40, which controls and/or regulates the vital control units. In another embodiment 33, the invention incorporates a TEMP Sense unit 42, that senses and/or reads and/or displays the temperature. In another embodiment 33, the invention incorporates a radiator 41, which may act as a cooling mechanism, in another embodiment 33, the invention incorporates a pump 43, such as, a water pump 43, for circulation and cooling purposes. In another embodiment 33, the invention incorporates a flow switch 45, which regulates fluid flow, such as, water flow. In another embodiment 33, the invention incorporates a temperature fuse 47, which may act as a thermal fuse 47, and/or a backup fuse 47, to shut the apparatus 23, down if the temperature exceeds a certain threshold. In another embodiment 33, the invention incorporates an auxiliary controller as a "watchdog" mechanism 46.

Figure 3B:
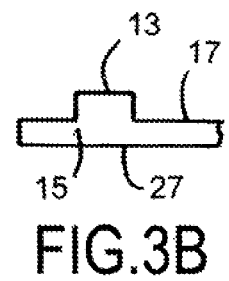
FIG. 3B is a side cut-away view of a top cold plate taken along section 3B-3B, of FIG. 3A.

FIG. 3A is a top view of a top cold plate 15, in accordance with an embodiment, of the present invention, showing the sites 13, for the sites or locations for the placement of the device under test 12, while FIG. 3B is a side cut-away view of a top cold plate 15, taken along section 3B-3B, of FIG. 3A. For some embodiments the top cold plate 15, could have a base device under test (DOT) area 13, that extends above the upper surface 17, forming a plateau 13, or below the upper surface 17, forming, for example, a blind hole 29, (shown in FIG. 4B) on the top cold plate 15. The base device under test (DUT) area 13, would allow for a defined area on the top cold plate 15, for the placement of the device under test 12.

Figure 4B:
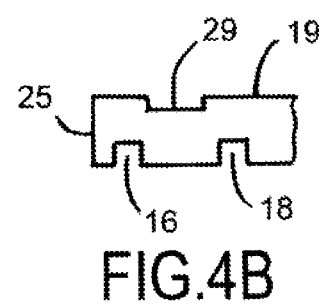
FIG. 4B is a side cut-away view of a bottom cold plate taken along section 4B-4B, of FIG. 4A.

FIG. 4A is a top view of a bottom cold plate 25, in accordance with an embodiment of the present invention, showing the sites 29, for the location or placement of the thermoelectric element or cooler (TEC) 22, while FIG. 4B is a side cut-away view of a bottom cold plate 25, taken along section 4B-4B, of FIG. 4A. For some embodiments the bottom cold plate 25, could have a base thermoelectric cooler (TEC) area 29, that extends above the upper surface 19, forming a plateau 13, (shown in FIG. 3B), or below the upper surface 19, forming, for example, a blind hole 29, on the bottom cold plate 25. The base thermoelectric cooler (TEC) area 29 would allow for a defined area on the bottom cold plate 25, for the placement of the thermoelectric element or cooler (TEC) 22. For some embodiments the bottom cold plate 25, could also have at least one inlet channel 16, and at least one outlet channel 18, for the passage of fluid, such as, air, liquid. For some embodiments the channels 16, 18, could be used to embed or accommodate the fluid pipes 26, 28.

This novel apparatus 23, handles next generation burn-in systems, eliminates the use of complex burn-in chambers and reduces cost of burn-in and cost of test.

One embodiment of the present invention is comprised of a top or first cold plate 15, such as, that described in FIGS. 3A and 3B, above, a bottom or second cold plate 25, with integrated cooling tubes for cold water, such as, that described in FIGS. 4A, and 4B, above, thermo-electro element or cooler (TEC) 22, and a PID loop 14, managed by the PC controller 20.

One objective of a burn-in reliability test using, for example, the apparatus 23, or the schematic 33, is to determine the high temperature operating life of die devices 12. In general, a burn-in test, using, for example, the thermal control and management apparatus 23, or the thermal control and management schematic 33, which consists of subjecting the devices 12, to varying temperatures for specified number of hours.

In a preferred embodiment, the cold plates 15, 25, are made of aluminum primarily because of its low cost and high coefficient of heat transfer. However, this is not intended to be a limitation on the embodiments of the present invention and other materials are contemplated within the scope of the present invention, including, but not limited to other metals, ceramics, plastics, composite materials, or other suitable materials, and combinations thereof.

Between the two cold plates 15, 25, are the thermo-electro element or cooler (TEC) 22, which are used to control the conductance of heat between the top cold plate 15, and the bottom cold plate 25. By adjusting the power to the thermo-electro cooler (TEC) 22, the temperature of top cold plate 15, can be controlled at the desired level.

The thermo-electro element or cooler (TEC) 22, acts as a heat pump; when direct current runs through it, heat is moved from one side to the other. Therefore, it can be used either for heating or for cooling (refrigeration); for the embodiments herein the primary purpose is cooling. In alternate embodiments the thermo-electro cooler (TEC) 22, can also be used as a temperature controller that either heats or cools the device under test (DUT) 12.

Fluid pipes 26, 28, such as, cooling pipes 26, 28, may be embedded in the bottom cold plate 25, to facilitate heat removal from the thermo-electro cooler (TEC) 22. In operation, for example, fluid, such as, air or chilled water or liquid or antifreeze may be used to continuously flow through the cooling pipes 26, 28, that may be embedded in the bottom cold plate 25, or associated therewith.

Some advantages of the thermo-electro element or cooler (TEC) 22, include (as contrasted to a vapor-compression refrigerator) its lack of moving parts or circulating liquid, and its relatively small size and flexible shape (form factor).

The PID loop 14, is a control feedback loop 14, and includes a temperature sensing element (not shown) but which is attached to the device under test (DUT) 12, by methods well known in the art. The PID loop 14, is programmed via off-the-shelf software, such as, software sold by National Instruments, to sense the input temperature of the device under test 12, and adjust the power to the thermo-electro element or cooler (TEC) 22, to maintain the desired temperature of the device under test (DUT) 12.

The system 23, 33, can be programmed to measure the temperature and adjust the power to the thermo-electro cooler (TEC) 22, for example, to at least five (5) times a second.

In alternate embodiments the ITC360™ 23, 33, is used to test any component 12, device 12, assembly 12, or any other element 12, that it is desirable to maintain at a specified temperature.

In one embodiment 23, 33, the thermo-electro element or cooler (TEC) 22, on the bottom cold plate 25, are controlled individually as opposed to the entire group. In this embodiment 23, 33, different devices under test 12, can be simultaneously tested at different temperatures, provided that it is designed to have appropriate PID loops 14, for each different device under test 12.

The PID controller 20, calculates an "error" value as the difference between a measured process variable and a desired set point. The PID controller 20, attempts to minimize the error by adjusting the process control inputs.

The PID controller 20, calculation algorithm involves three separate constant parameters, and is accordingly sometimes called three-term control: the Proportional, the Integral, and Derivative values, denoted by, P, I, and D, respectively. Heuristically, these values can be interpreted in terms of time: P depends on the present error, I on the accumulation of past errors, and D is a prediction of future errors, based on the current rate of change. The weighted sum of these three actions is used to adjust the power to the thermo-electro cooler (TEC) 22.

In the absence of knowledge of the underlying process, a PID controller 20, is a good controller to use. By tuning the three parameters in the PID controller algorithm, the controller 20, can provide control action designed for specific process requirements.

Figure 5:
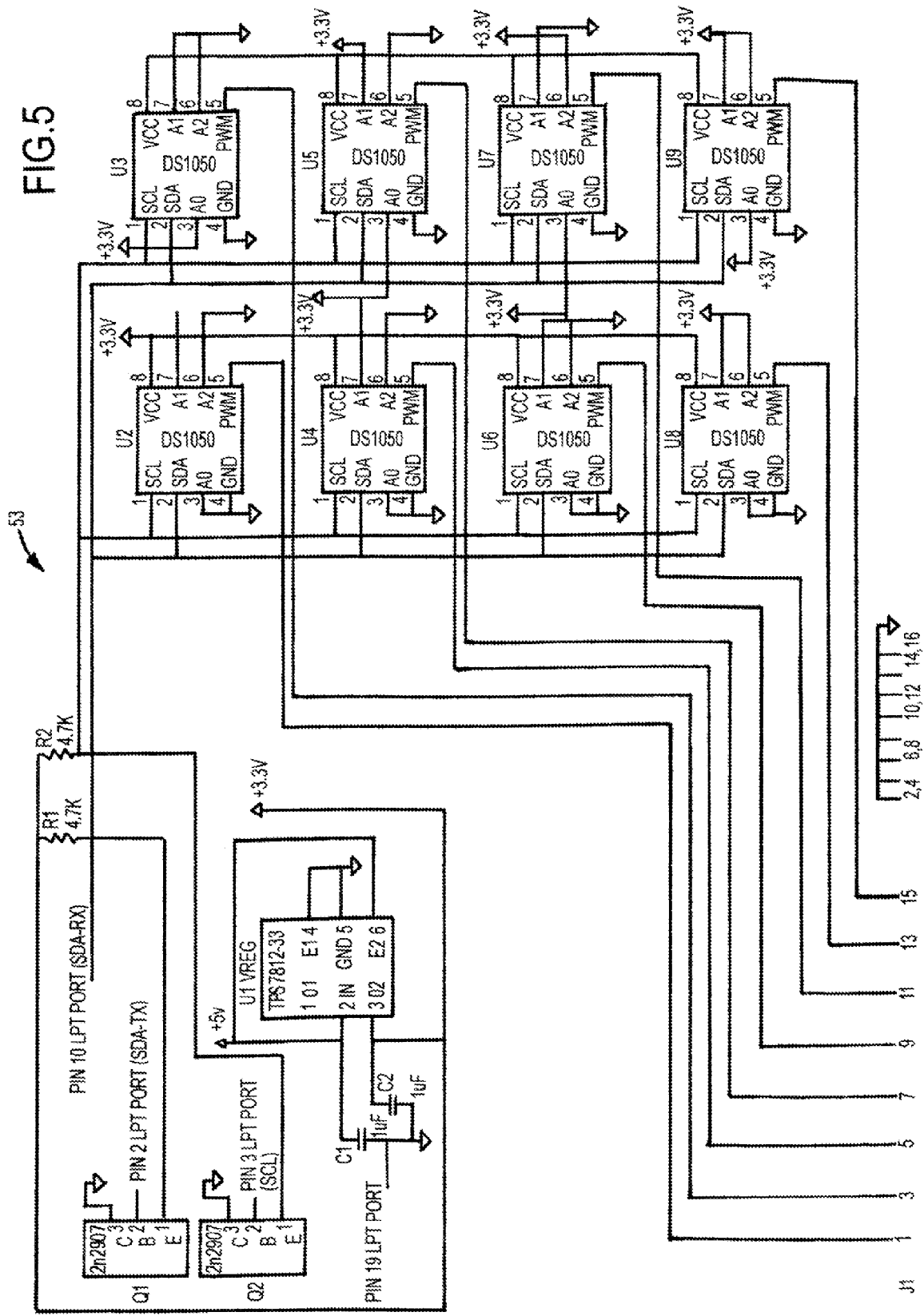
FIG. 5 illustrates an exemplary embodiment of an eight (8) channel schematic of a PWM Control.

FIG. 5, illustrates an exemplary embodiment of an eight (8) channel schematic of a PWM Control 53, or a pulse-width modulation (PWM) control 53. It should be noted that for the purposes of illustration an eight (8) channel schematic of a PWM Control 53, is shown in FIG. 5, however, one can have more or less than eight (8) channel. It should be noted that PWM (pulse width modulation) is a method to control the energy applied to the thermo-electro cooler (TEC) 22, to affect the temperature of the DUT 12.

Figure 6:
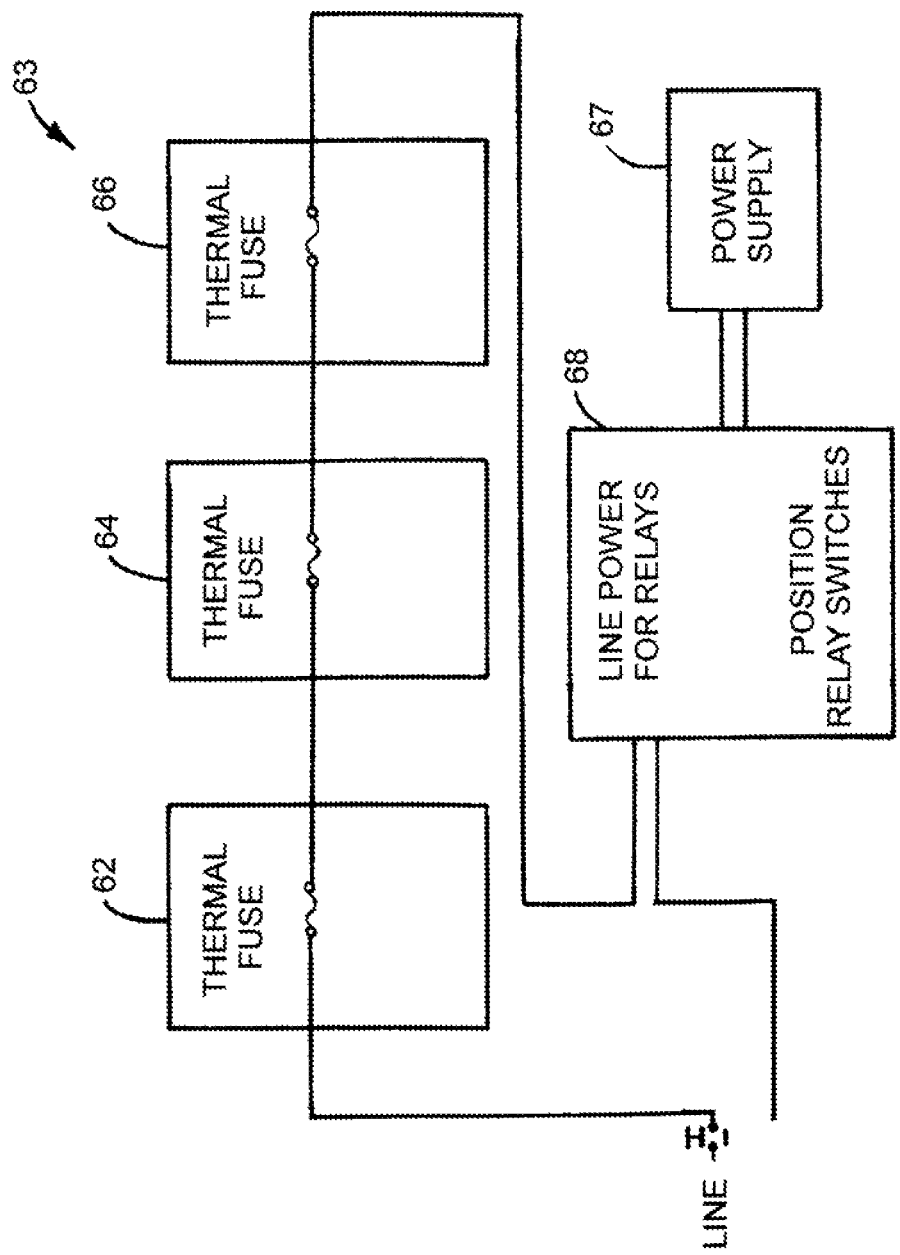
FIG. 6 illustrates an exemplary embodiment of a safety, over-temperature interlock schematic.

FIG. 6, illustrates an exemplary embodiment of a safety, over-temperature interlock schematic 63. The interlock schematic 63, has thermal fuse 62, 64, 66, along with a power supply 67, and a line power for relays 68, along with position relay switches for power supply 68. For some embodiments, the Interlock schematic 63, can be used to provide safety to the apparatus 23, while it is in operation.

Figure 7:
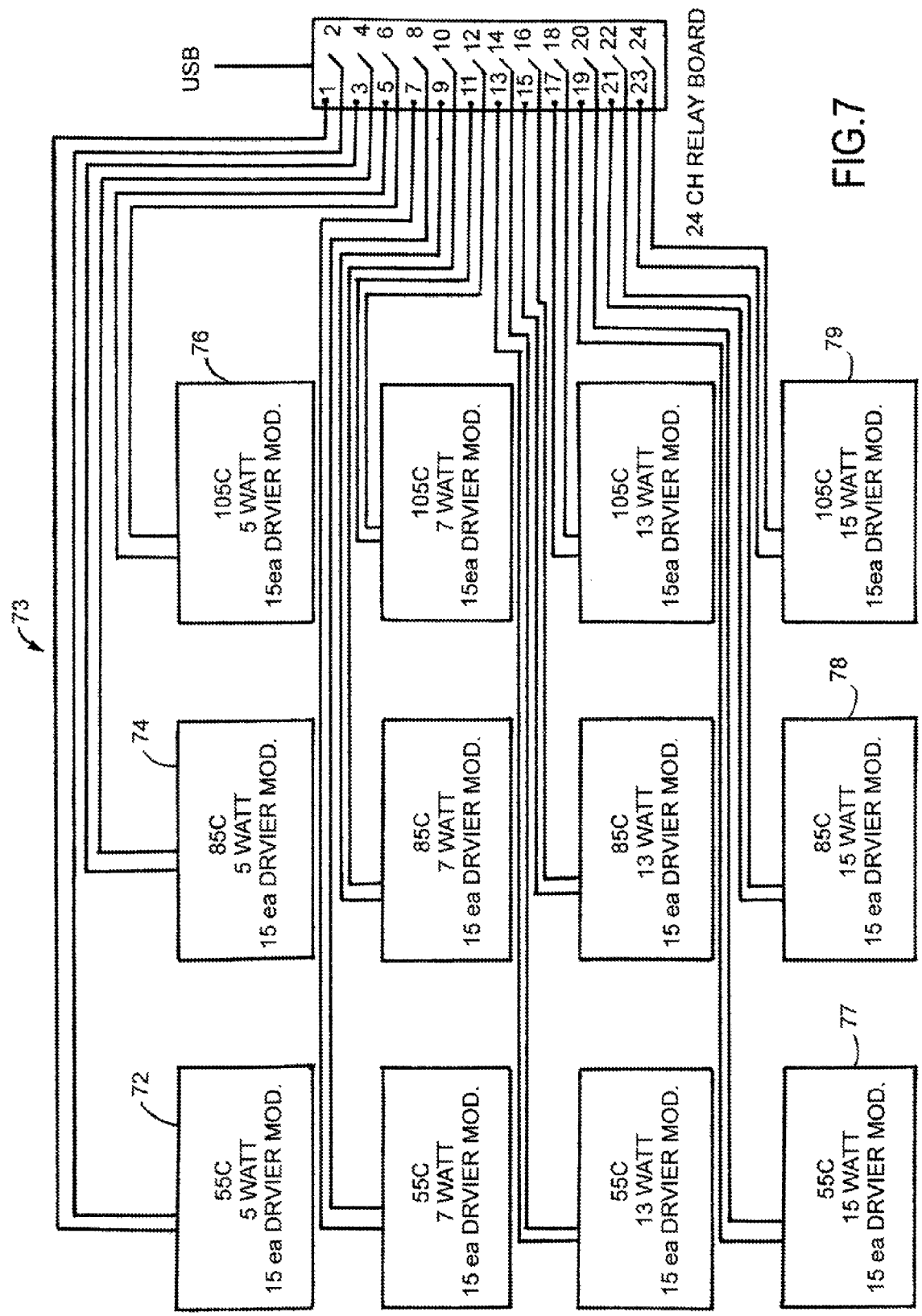
FIG. 7 illustrates an exemplary embodiment of a DUT power control safety subsystem having a 24 channel relay board.

FIG. 7, illustrates an exemplary embodiment of a device under test (DUT) power control safety subsystem having a 24 channel relay board 73. For the purposes of illustration only, a subsystem showing a 24 channel relay hoard 73, having 12 test sites is shown, however, one could easily have more or less than 24 channel relay board 73, or more or less test sites than 12, as illustrated. As one can appreciate that each site, for example, site 72, 74, 76, 77, 78, 79, can be modulated to have a higher power or wattage or higher or lower site temperature, and this of course would depend upon the power being supplied to the individual test site 72, 74, 76, 77, 78, 79. As stated elsewhere the individual test sites 72, 74, 76, 77, 78, 79, could be supplied with the same power or different power, which would be used to excite the thermoelectric element or cooler (TEC) 22, to either cool or heat the corresponding device under test (DUT) 22.

Figure 8:
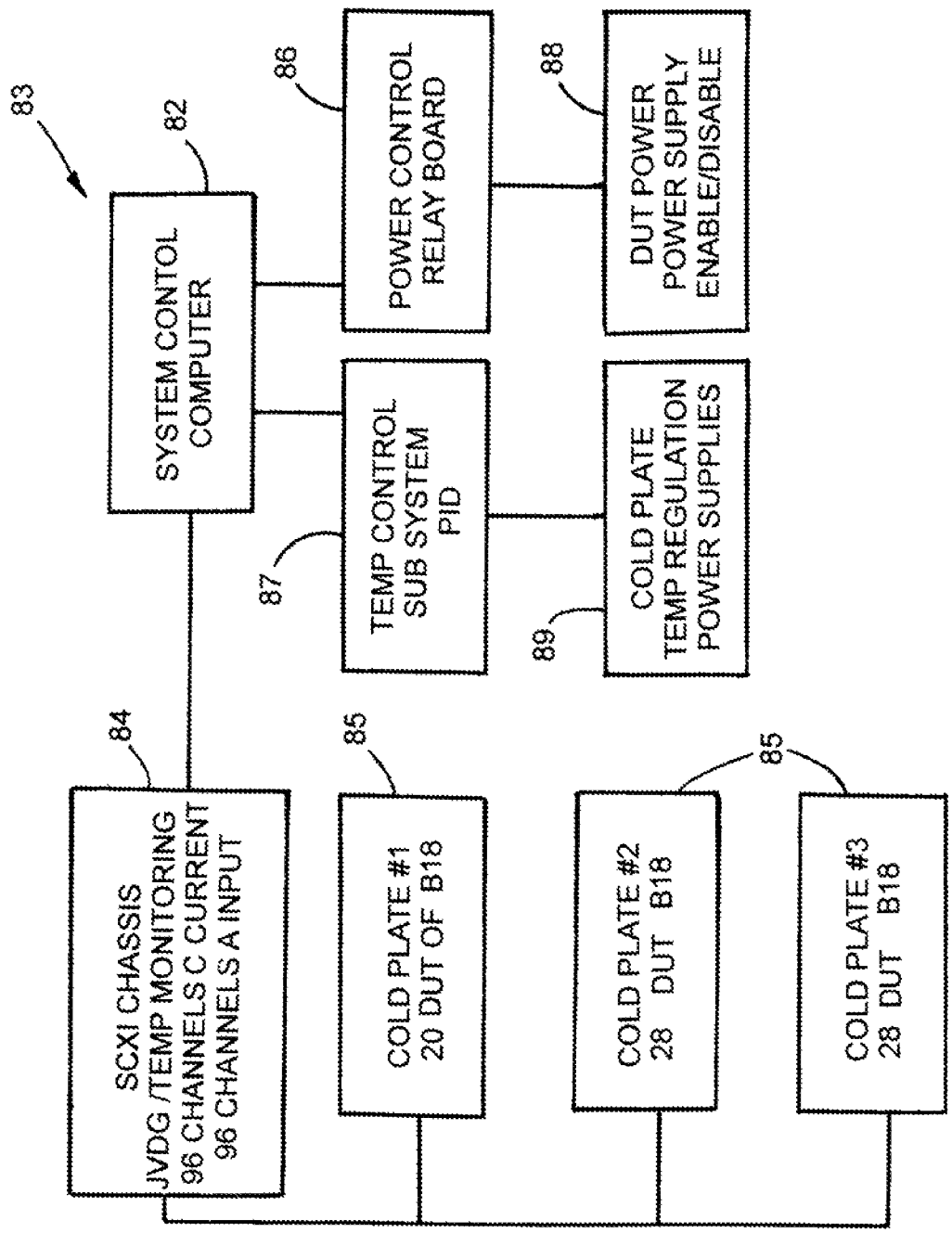
FIG. 8, illustrates an exemplary embodiment of a JVDC daq system.

FIG. 8, illustrates an exemplary embodiment of a JVDC daq system or data acquisition system 83. For some embodiments, the data acquisition system 83, can comprise a system control computer 82, which would interface with a power control relay hoard 86, a device under test (DUT) power supply 88, a temperature control sub-system 87, a cold plate temperature regulation power supply 89, a chassis 84, and which could monitor one or more cold plate 85. For the purposes of illustration only, FIG. 8 is showing three cold plates 85, that are being managed, however, the data acquisition system 83, could have one or more cold plates 85, to manage. The cold plate 85, could be the top cold plate 15, or the bottom cold plate 25, or both. It should be noted that JVDC daq or junction voltage data acquisition refers to a method of determining the temperature of the device under test (DUT) 12, and is the feedback used to adjust the energy applied to the thermoelectric element or cooler (TEC) 22, via the pulse width modulation (PWM).

It should be appreciated that at least one of the at least one thermoelectric element or cooler (TEC) 22, can be configured to provide cooling and/or heating response times on the order of one second or less.

For some embodiments, at least one of the at least one thermoelectric element or cooler (TEC) 22, should be configured to provide cooling and/or heating at levels in the range of between about 0.1 W/cm2 to about 2000 W/cm2.

As noted previously, the forgoing descriptions of the specific embodiments are presented for purposes of illustration and description. They are not intended to be exhaustive or to limit the invention to the precise forms disclosed and obviously many modifications and variations are possible in view of the above teachings. The embodiments were chosen and described in order to explain the principles of the invention and its practical applications, to thereby enable those skilled in the art to best utilize the invention and various embodiments thereof as suited to the particular use contemplated. It is intended that the scope of the invention be defined by the claims and their equivalents.

What is claimed is:

1. A thermal control and management apparatus, comprising:
   (a) a bottom cold plate, said bottom cold plate having an upper surface and a lower surface;
   (b) a top cold plate, said top cold plate having an upper surface and a lower surface;
   (c) at least one thermoelectric cooler between said lower surface of said top cold plate, and said upper surface of said bottom cold plate;
   (d) a device under test board, and wherein said device under test board is in electrical contact with a power supply;
   (e) at least one device under test, and wherein said device under test is in electrical contact with said power supply via said device under test, board, and wherein said at least one device under test is located on said upper surface of said top cold plate such that said at least one thermoelectric cooler can thermally influence said at least one device under test when said thermoelectric cooler is activated; and
   (f) a controller, wherein said controller has at least one first means to provide power to said at least one thermoelectric cooler to thermally activate said at least one thermoelectric cooler, and wherein said controller has at least one second means to monitor and manage the thermal impact on said at least one device under test from said thermal activation of said at least one thermoelectric cooler.

2. The thermal control and management apparatus of claim 1, wherein one of said first means and said second means is a PID loop.

3. The thermal control and management apparatus of claim 1, wherein said controller has at least one means to monitor temperature, and wherein said temperature is selected from a group consisting of a temperature gradient of specification temperature, an actual operating temperature, an ambient temperature, and a surrounding temperature.

4. The thermal control and management apparatus of claim 1, wherein said at least one device under test is selected from a group consisting of a burn-in of a semiconductor, a microprocessor, an LED, and an electrical component.

5. The thermal control and management apparatus of claim 1, wherein material for said top cold plate and said bottom cold plate is selected from a group consisting of aluminum, metal, ceramic, plastic, composite material, and combinations thereof.

6. The thermal control and management apparatus of claim 1, wherein said bottom cold plate has at least one fluid pipe for the passage of at least one fluid, and wherein said at least one fluid is selected from a group consisting of air, liquid, water, chilled water, and antifreeze.

7. The thermal control and management apparatus of claim 1, wherein said bottom cold plate has at least one fluid inlet pipe, and at least one fluid outlet pipe.

8. The thermal control and management apparatus of claim 1, wherein said bottom cold plate has at least one channel for the passage of at least one thud, and wherein said at least one fluid is selected from a group consisting of air, liquid, water, chilled water, and antifreeze.

9. The thermal control and management apparatus of claim 1, wherein said bottom cold plate has at least one fluid inlet channel, and at least one fluid outlet channel.

10. The thermal control and management apparatus of claim 1, wherein said top cold plate has at least one location for the placement of said device under test, and wherein said location is selected from a group consisting of a plateau, a flat surface, and a blind hole.

11. The thermal control and management apparatus of claim 1, wherein said bottom cold plate has at least one location for the placement of said thermoelectric cooler, and wherein said location is selected from a group consisting of a plateau, a flat surface, and a blind hole.

12. The thermal control and management apparatus of claim 1, wherein said at least one thermoelectric cooler is configured to at least one of heat and cool said at least one device under test.

13. The thermal control and management apparatus of claim 1, wherein said at least one thermoelectric cooler is configured to selectively maintain a predetermined temperature Of at least one of said at least one device under test.

14. The thermal control and management apparatus of claim 1, wherein at least one of said at least one thermoelectric cooler is configured to provide cooling and/or heating response times on the order of one second or less.

15. The thermal control and management apparatus of claim 1, wherein at least one of said at least one thermoelectric cooler is configured to provide cooling and/or heating at levels in the range of between about 0.1 W/cm$^2$ to about 2000 W/cm$^2$.

16. A thermoelectric, cooling and heating apparatus, comprising:
(a) a bottom cold plate, said bottom cold plate having an upper surface and a lower surface;
(b) a top cold plate, said top cold plate having an upper surface and a lower surface;
(c) at least one thermoelectric element arranged between said lower surface of said top cold plate, and said upper surface of said bottom cold plate, and configured to perform at least one of selective heating and cooling, each of said at least one thermoelectric element including, a thermoelectric material, a Peltier contact contacting said thermoelectric material and configured to form under electrical current flow at least one of a heated junction and a cooled junction, and electrodes configured to provide electric current through said thermoelectric material and said Peltier contact;
(d) a device under test board, and wherein said device under test board is in electrical contact with a power supply;
(e) at least one device under test, and wherein said device under test is in electrical contact with said power supply via said device under test board, and wherein said at least one device under test is located on said upper surface of said top cold plate such that said at least one thermoelectric element can thermally influence said at least one device under test when said thermoelectric element is activated; and
(f) a controller, wherein said controller is configured to independently control said electrodes of said at least one thermoelectric, element, said controller being further configured to bias said electrodes to provide one of heating and/or cooling to said at least one thermoelectric element, and wherein said controller has at least one means to monitor the thermal impact on said at least one device under test from said thermal activation of said at least one thermoelectric element.

17. The thermoelectric cooling and heating apparatus of claim 16, wherein one of said first means and said second means is a PID loop.

18. The thermoelectric cooling and heating apparatus of claim 16, wherein said controller has at least one means to monitor temperature, and wherein said temperature is selected from a group consisting, of a temperature gradient of specification temperature, an actual operating temperature, an ambient temperature, and a surrounding temperature.

19. The thermoelectric cooling and heating apparatus of claim 16, wherein said at least one thermoelectric cooler is configured to at least one of heat and cool said at least one device under test.

20. A method for providing thermoelectric cooling and heating, comprising the steps of:
(a) sandwiching at least one thermoelectric element between a bottom cold plate and a top cold plate, said at least one thermoelectric element arranged between a lower surface of said top cold plate, and an tipper surface of said bottom cold plate, and configured to perform at least one of selective heating, and cooling, and wherein each of said at least one thermoelectric element including, a thermoelectric material, a Peltier contact contacting said thermoelectric material and configured to form under electrical current flow at least one of a heated junction and a cooled junction, and electrodes configured to provide electric current through said thermoelectric material and said Peltier contact;
(b) placing a device under test board, and wherein said device under test board is in electrical contact with a power supply;
(c) placing at least one device under test on said upper surface of said top cold plate, and wherein said device under test is in electrical contact with said power supply via said device under test board, and wherein said at least one thermoelectric element is configured to thermally influence said at least one device under test when said thermoelectric element is activated; and
(d) providing a controller, wherein said controller is configured to independently control said electrodes of said at least one thermoelectric element, said controller being further configured to bias said electrodes to provide one of heating and/or cooling to said at least one thermoelectric element, and wherein said controller has at least one means to monitor the thermal impact on said at least one device under test from said thermal activation of said at least one thermoelectric element.

21. The method for providing thermoelectric cooling and heating of claim 20, wherein one of said first means and said second means is a PID loop.

22. The method for providing thermoelectric cooling and heating of claim 20, wherein said controller has at least one means to monitor temperature, and wherein said temperature is selected from a group consisting of a temperature gradient of specification temperature, an actual operating temperature, an ambient temperature, and a surrounding temperature.

23. The method for providing thermoelectric cooling and heating of claim 20, wherein said at least one thermoelectric cooler is configured to at least one of heat and cool said at least one device under test.

* * * * *